United States Patent [19]

Noonan et al.

[11] Patent Number: 4,609,606
[45] Date of Patent: Sep. 2, 1986

[54] POLYESTERS COMPRISING RECURRING PHOTOCONDUCTIVE AND PHOTOCROSSLINKABLE UNITS AND ELEMENTS THEREOF

[75] Inventors: John M. Noonan; Jerome H. Perlstein; Michael Scozzafava, all of Rochester, N.Y.

[73] Assignee: Eastman Kodak Company, Rochester, N.Y.

[21] Appl. No.: 718,315

[22] Filed: Apr. 1, 1985

[51] Int. Cl.$^4$ .................. G03G 5/07; G03C 1/68
[52] U.S. Cl. ........................ 430/69; 430/49; 525/22; 525/441
[58] Field of Search .......... 525/22, 441; 430/49, 430/69; 204/159.19

[56] References Cited

U.S. PATENT DOCUMENTS

| | | | |
|---|---|---|---|
| 3,459,690 | 8/1969 | Baugh et al. | 525/441 |
| 3,929,489 | 12/1975 | Arcesi et al. | 430/281 |
| 4,101,326 | 7/1978 | Barkey | 96/67 |
| 4,139,390 | 2/1979 | Rauner et al. | 96/91 |
| 4,157,261 | 6/1979 | Takeda | 96/28 |
| 4,187,112 | 2/1980 | Etoh et al. | 430/285 |
| 4,190,446 | 2/1980 | Martin et al. | 430/25 |
| 4,258,112 | 3/1981 | Kaukeinen et al. | 430/34 |
| 4,267,961 | 5/1981 | Martin et al. | 250/226 |
| 4,291,115 | 9/1981 | Chambers | 430/271 |
| 4,327,170 | 4/1982 | Sander et al. | 430/285 |
| 4,331,751 | 5/1982 | Isaacson et al. | 430/18 |
| 4,340,454 | 7/1982 | Martin et al. | 204/159 |
| 4,361,636 | 11/1982 | Isaacson et al. | 430/32 |
| 4,395,475 | 7/1983 | Noonan et al. | 439/69 |

OTHER PUBLICATIONS

Research Disclosure Number 158, pp. 23-31, Jun. 1977.
Research Disclosure Number 228, pp. 151-154, Apr. 1983.

*Primary Examiner*—John E. Kittle
*Assistant Examiner*—Mukund J. Shah
*Attorney, Agent, or Firm*—John R. Everett

[57] ABSTRACT

A polyester comprising at least 12 mole percent polymerized recurring units containing an arylamine photoconductive component and at least 15 mole percent polymerized recurring units containing a photopolymerizable component and wherein each of said components is responsive to a different wavelength of light. The polyesters are useful in radiation-sensitive elements, particularly lithographic elements.

12 Claims, No Drawings

PATENT NO. 4,609,606

POLYESTERS COMPRISING RECURRING PHOTOCONDUCTIVE AND PHOTOCROSSLINKABLE UNITS AND ELEMENTS THEREOF

FIELD OF THE INVENTION

The present invention relates to polyesters comprising recurring photoconductive and photocrosslinkable components and radiation-sensitive elements comprising such polyesters.

BACKGROUND OF THE INVENTION

Lithographic elements and processes for making such elements are well known. A typical lithographic process for the preparation of lithographic plates requires preparation of the original to be duplicated. Then a negative or positive silver halide graphics arts transparency of the original is prepared with a magnification/reduction camera by exposing a silver halide graphics arts film to the original. The film is then developed. The transparency is masked on a stripping table to arrange the borders as desired. Additional transparencies can be overlayed to make corrections or add to or from the image areas.

The transparency and a light-sensitive lithographic element are punched for alignment, mounted, and drawn down on a vacuum frame. The lithographic element is exposed through the transparency with high intensity UV radiation to crosslink or degrade the non-image areas of the photosensitive material coated on the lithographic element. The plate is developed by washing away the unexposed (crosslinked) areas in case of a negative working lithographic element, or the exposed (degraded) areas in the case of a positive working lithographic element to produce a lithographic element.

The lithographic plates of U.S. Pat. No. 3,929,489 are typical. This patent discloses a lithographic element in which a radiation-sensitive layer comprises a polyester having radiation-sensitive photocrosslinkable components. The disadvantage of the lithographic plates of the prior art as exemplified in U.S. Pat. No. 3,929,489 is that they require the preparation of a separate silver halide graphic arts transparency to make a lithographic plate. It is desirable to eliminate the need for the aforementioned transparency from the process of making a lithographic plate.

SUMMARY OF THE INVENTION

The present invention provides a photoconductive-photocrosslinkable polyester comprising at least 12 mole percent recurring units containing an arylamine photoconductive component and at least 15 mole percent recurring units containing a photopolymerizable component and wherein each of said components is responsive to a different wavelength of light.

The polyesters are useful in making radiation-sensitive elements, particularly lithographic elements, comprising a conductive support in electrical contact with the radiation-sensitive layer having therein a polyester of the present invention.

The element can be used in forming a lithographic plate comprising the steps of corona charging the radiation sensitive element comprising a radiation-sensitive layer having therein a polyester of this invention;

exposing the element to the original to be duplicated with radiation to which the photoconductive component of the polyester is sensitive thereby forming an electrostatic latent image of the original;

developing the latent image with an electrostatic toner composition;

exposing the element bearing the electrostatic image to radiation to which the photocrosslinkable component of the polyester is sensitive thereby crosslinking the polyester in the exposed area; and treating the element bearing the crosslinked polymer areas with a developer to remove the developed electrostatic image and the uncrosslinked (unexposed) polymer thereby forming image areas in the crosslinked polyester.

This method does not use a separate silver halide transparency in making a lithographic plate.

PREFERRED EMBODIMENTS OF THE INVENTION

In a preferred embodiment of the invention, the polymerized recurring units containing the arylamine photoconductive component (a) comprises from 12 to 50 mole percent of the polyester and (b) has the structure $$\begin{array}{c} | \\ (CH_2)_n \\ | \\ R^1 \\ | \\ A \\ R^2 \diagup \diagdown R^3 \end{array}$$

wherein n is an integer of from 1 to 6;

A represents nitilo, alkanetriyl or alkenetriyl;

$R^1$ represents arylene;

$R^2$ and $R^3$ each independently represents dialkylaminoaryl, diarylaminoaryl, arylalkylamino, or when A is nitrilo, $R^2$ and $R^3$ are each independently alkyl or aryl.

In another preferred embodiment, the polymerized recurring units containing the photocrosslinkable component (a) comprises from 15 to 50 mole percent of the polymerized recurring polyester, (b) is attached to the condensation residue of an organic diacid, and (c) is selected from those having the structures $$R^4=CH-CH=C\diagup^{\displaystyle\overset{O}{\underset{\|}{C}}-}_{\diagdown\overset{\|}{\underset{O}{C}}-}\qquad (A)$$

wherein $R^4$ represents an alkylidene, aralkylidene or heterocyclic group, or a derivative thereof;

$$-\overset{O}{\underset{\|}{C}}-\underset{R^6}{\overset{|}{C}}=CH-CH=\underset{R^6}{\overset{|}{C}}-\overset{O}{\underset{\|}{C}}-\qquad (B)$$

wherein $R^6$ is a hydrogen atom or a methyl group;

(C)

wherein
Z represents the atoms necessary to form an unsaturated, bridged or unbridged carbocyclic nucleus typically having 6 to 7 carbon atoms;

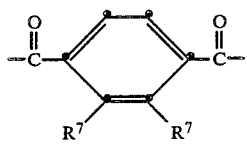
(D)

wherein
each $R^7$ is a hydrogen atom, an alkyl group of 1 to 12 carbon atoms of branched or straight chain or cyclic configuration; and

(E)

Alkanetriyl refers to groups such as methylidyne, ethylidyne, propylidyne, benzylidyne, propane-1,3,3-triyl and the like. Alkenylidyne refers to anologous unsaturated alkanetriyl groups such as ethen-1,2,2-triyl, propen-1,3,3-triyl, 1-(2-thienyl)-1-propen-1,3,3-triyl and the like. Alkyl refers to groups such as methyl, ethyl, propyl, isopropyl and the like. Aryl refers to phenyl or naphthyl, methylphenyl and dimethylphenyl. Alkylidene refers to methylene, propylene and the like. Aralkylidene refers to phenylmethylene, phenylpropylene and the like.

DETAILS OF THE INVENTION

It is essential that the arylamine photoconductive component and the photocrosslinkable component respond to different wavelengths of light. Thus, in cases where both components are sensitive to the same wavelength of light, either the photoconductive component or the photocrosslinkable component can be sensitized to a different wavelength. Methods and materials for accomplishing such sensitization are well known in the photocrosslinking and and the photoconductive arts.

The recurring arylamine photoconductive component is appended to the condensation residue of a diacid component, or the condensation residue of a diol, diamine, or hydroxy substituted amine component of the polyesters of this invention.

Such recurring arylamine photoconductive components are attached to the diacid residue of the polyester, for example, by basic condensation of an arylamine photoconductor having an aldehyde substituent with an active methylene of a diacid radical to produce an unsaturated bond joining the photoconductor to the diacid portion of the polyester. The unsaturated bond is thereafter reduced by hydrogenation over a palladium/charcoal catalyst. Schematically, the preparation of the arylamine-containing group is shown as follows:

(I)

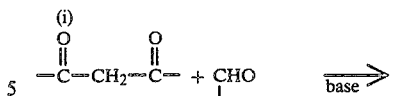
(i)

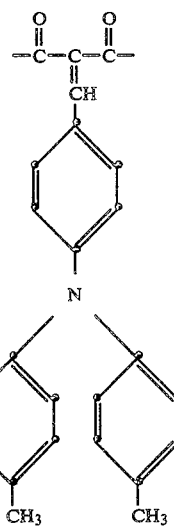

(ii)
(I) + H$_2$ $\xrightarrow{Pd/C}$

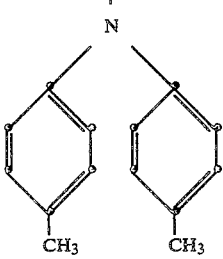

Examples of useful arylamine photoconductors having the required aldehyde group include 4,4'-(4-formylbenzylidene)bis(N,N-diethyl-m-toluidine), 4-anilinobenzaldehyde; 4,4'-(4-formylbenzylidene)-bis(N,N-dibenzyl-m-toluidine); 4,4'-(4-formylbenzylidene)bis(N,N- dicyclohexyl-m-toluidine); 4,4'-(4-formylbenzylidene)-bis(N-benzyl-N-ethyl-m-toluidine); 4-diethylamino-4'-formyltetraphenylmethane; 1-[4-(N,N-dimethylamino)-phenyl]-1-(4-formylphenyl)-1-phenylethane; 4-(2-naphthylamino)benzaldehyde; 4-[3,3-bis(4-diethylamino-o-tolyl)-1-thienyl-1-propen-1-yl]benzaldehyde; 4-(di-p-tolylamino)benzaldehyde; and p-dimethylaminobenzaldehyde.

The recurring arylamine photoconductor group can also be attached to a diacid precursor of the polyester followed by polycondensation of the diacid component with the other appropriate condensation polymer components. Alternatively, the arylamine is attached to the diacid component of a preformed polymer. The alternative method is preferred in the event that high molecular weight polymers are desired.

Particularly useful arylamine photoconductors which can be attached to the diacid residue of the polyesters include triphenylamine-type photoconductors, including substituted triphenylamines. Especially useful organic photoconductors in this regard are triphenylamine, 4-diphenylaminochalcone, 4-hydroxymethyltriphenylamine, 4-carboxytriphenylamine, and 4-(α-hydroxyethyl)triphenylamine. Other useful triphenylamine photoconductors are disclosed in, for example, U.S. Pat. No. 3,180,730 granted to Klupfel et al, Apr. 27, 1965.

When it is desirable to append the arylamine to the condensation residue of the diol, diamie or hydroxy substituted amine component of the polyesters, dicarboxylic acids containing the pendant arylamine are chemically reduced to yield the corresponding diol. Exemplary dicarboxylic acids containing an arylamine photoconductive component and which are readily reduced to diols include 2-{4-[bis(4-diethylamino-o-tolyl)methyl]-benzyl}malonic acid; 2-(4-anilinobenzyl)-malonic acid; 2-{4-[bis(4-dibenzylamino-o-tolyl)methyl]-benzyl}malonic acid; 2-{4-[bis(4-dicyclohexylamino-o-tolyl)methyl]benzyl}malonic acid; 2-{{4-{bis[4-(N-ethyl-N-benzyl)amino-o-tolyl]-methyl}benzyl}}malonic acid; 2-{4-[(4-diethylaminophenyldiphenyl)methyl]benzyl}malonic acid; 2-{4-[1-(4-dimethylaminophenyl)-1-phenylethyl]-benzyl}malonic acid; 2-[4-(2-naphthylamino)-benzyl]malonic acid; 2-{4-[3,3-bis(4-diethylamino-o-tolyl)-1-(2-thienyl)-1-propen-1-yl]-benzyl)malonic acid; 2-{4-[di(p-tolyl)amino]-benzyl]malonic acid and 2-(p-dimethylaminobenzyl)malonic acid.

Attachment of the arylamine to organic diamines or hydroxyamines can be carried out by known techniques such as by attaching the arylamine to an organic compound already having the diamine or hydroxyamine functionality. Alternatively, an arylamine can be treated to form the diamine or hydroxyamine functionality.

The photocrosslinkable component of the polyesters is attached to the diacid condensation residue. These components can be derived from the following dicarboxylic acids or their functional equivalents:

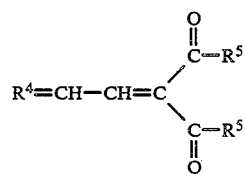

(A)

wherein $R^4$ represents an alkylidene, aralkylidene or heterocyclic group, or a derivative thereof; and $R^5$ represents halogen (preferably chlorine), hydroxy or alkoxy.

Examples of diacids that correspond to the general formula (A) and that are particularly useful in the practice of the present invention include cinnamylidenemalonic acid, 2-butenylidenemalonic acid, 3-pentenylidenemalonic acid, o-nitrocinnamylidenemalonic acid, naphthylallylidenemalonic acid, 2-furfurylideneethylidenemalonic acid, N-methylpyridylidene-2-ethylidenemalonic acid, N-methylquinolidene-2-ethylidenemalonic acid, N-methylbenzothiazolylidene-2-ethylidenemalonic acid, and the like, as well as functional derivatives of these acids. Such acids are fully disclosed by Philipot et al, U.S. Pat. No. 3,674,745, issued July 4, 1972.

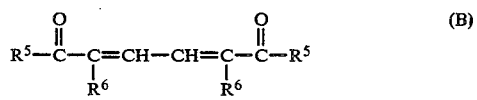

(B)

wherein $R^5$ is as previously defined; and $R^6$ is a hydrogen atom or a methyl group.

Exemplary muconic acids are trans, trans-muconic acid; cis, trans-muconic acid; cis, cis-muconic acid; α,α'-cis, trans-dimethylmuconic acid, and α,α'-cis, cis-dimethylmuconic acids. Other compounds useful in forming repeating units are more fully disclosed in McConkey U.S. Pat. No. 3,615,434, issued Oct. 26, 1971.

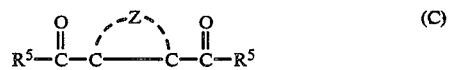

(C)

wherein $R^5$ is as previously defined; and

Z represents the atoms necessary to form an unsaturated, bridged or unbridged carbocyclic nucleus typically having 6 to 7 carbon atoms.

Such a carbocyclic nucleus can be substituted or unsubstituted. Particularly suitable acid units are 4-cyclohexene-1,2-dicarboxylic acid, 5-norbornene-2,3-dicarboxylic acid, hexachloro-5-[2:2:1]bicycloheptene-2,3-dicarboxylic acid and the like. Such acids are fully disclosed in Canadian Pat. No. 824,096, issued Sept. 30, 1969.

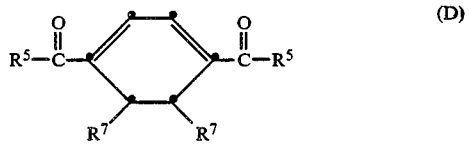

(D)

wherein $R^5$ is as previously defined; and each $R^7$ is a hydrogen atom, an alkyl group of 1 to 12 carbon atoms of branched or straight chain or cyclic configuration (e.g., methyl, ethyl, propyl, isopropyl, butyl, t-butyl, amyl, neopentyl, cyclohexyl, etc.) or an aryl group including mono- or polynuclear aryl groups such as phenyl, naphthyl, etc.

The alkyl and aryl groups can be substituted with such substituents as do not interfere with the condensation reaction, such as halo, nitro, aryl, alkoxy, aryloxy and the like. Particularly suited cyclohexadiene dicarboxylic acid units include 1,3-cyclohexadiene-1,4-dicarboxylic acid; 1,3-cyclohexadiene-1,3-dicarboxylic acid, 1,3-cyclohexadiene-1,2-dicarboxylic acid; 1,5-cyclohexadiene-1,4-dicarboxylic acid; 1,5-cyclohexadiene-1,3-dicarboxylic acid; and alkylated and acylated derivatives of such dicarboxylic acids. Such acids as well as the functional derivatives thereof are fully disclosed in Belgian Pat. No. 754,892, issued Oct. 15, 1970.

The polyesters of this invention comprise, when desired, additional recurring units for any desired purpose such as varying solubility, charge control, compatibility with other components, adhesion, and toughness. Accordingly, the present polymers include optional repeating units comprising unsubstituted and substituted alkylene, arylene, arylenealkylene, cycloalkylene, heterocyclic groups and ethylenically unsaturated groups.

Preferred components for affecting the water solubility of the polyesters are up to 20 mole percent of anionic iminodisulfonyl and anionic sulfo components. Such components include 3,3'-[(sodioimino)disulfonyl]dibenzoic acid; 3,3'-[(potassioimino)disulfonyl[dibenzoic acid; 3,3'-[(lithioimino)disulfonyl[dibenzoic acid; 4,4'-[(lithioimino)disulfonyl]dibenzoic acid; 4,4'-[(sodioimino)disulfonyl]dibenzoic acid; 4,4'-[(potassioimino)-disulfonyl[dibenzoic acid; 3,4'-[(lithioimino)disulfonyl]-dibenzoic acid; 3,4'-(sodioimino)disulfonyl]dibenzoic acid; 4,4'-[(potassioimino)disulfonyl]dinaphthoic acid; 4-[N-potassio-N-(4-tolylsulfonyl)sulfamoyl]isophthalic acid; 5-sodiosulfoisophthalic acid; 5-(4-sodiosulfophenoxy)isophthalic acid; 5-(3-sodiosulfopropoxy)isophthalic acid; 5-sodiosulfo-1,3-cyclohexanedicarboxylic acid; 5-(4-sodiosulfocyclohexyloxy)-1,3-cyclohexanedicarboxylic acid and functional derivatives thereof.

All of the polyesters of this invention were prepared by the standard high-temperature, melt-condensation procedure. In the latter procedure a polymerization flask was charged with the appropriate glycols and diesters or their respective derivatives. The flask was capped with a Vigreaux condenser which was fitted with a nitrogen inlet tube. Gas was flushed through the system at 40 mL/min. The flask was immersed in a 235° C. salt bath to a level just below the stoppered side arm. When the chemical mixture became a homogeneous melt, one drop of tetraisopropyl orthotitanate was added as a catalyst.

The volatiles were distilled at 235° C. and at atmospheric pressure for 4 hours. The condenser and inlet tube were replaced with a stainless steel stirrer attached so as to be vacuum tight. The pressure was reduced to about 0.05 mm Hg and the polymer stirred at 200 rpm. The torgue applied by the melt to the stirrer was measured. When the torgue was high enough to indicate sufficient polymerization, the stirring and vacuum were stopped and the polymerization flask removed from the bath as quickly as possible. The polymerization flask was immersed in liquid nitrogen and the flask was broken away from the cold, solidified glassy polymer. Each polymer prepared is listed in Table I.

EXAMPLE 1

In the first preparation both the photoconductive and the photocrosslinkable components were incorporated into the portion of the polyester derived from acids as shown in the structure below.

POLYESTER, TABLE I

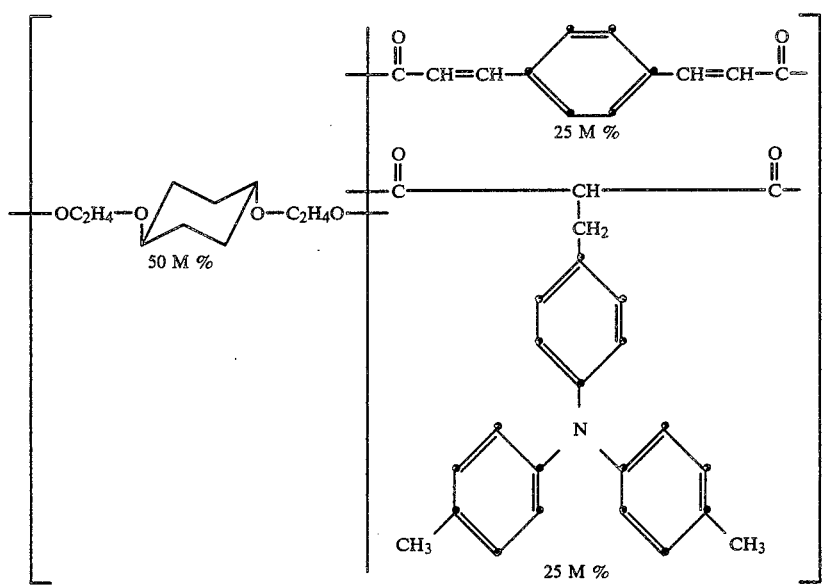

The glassy-amorphous polymer was amber-orange in color with a Tg of 49° C. This polymer is listed as Polymer 1 in Table I, infra.

EXAMPLE 2

In a second preparation the triarylamine photoconductive component was incorporated into the portion of the polyester derived from diols, and the photocrosslinkable component in the portion of the polyester derived from acids. See Polyester 3.

POLYESTER 3, TABLE I

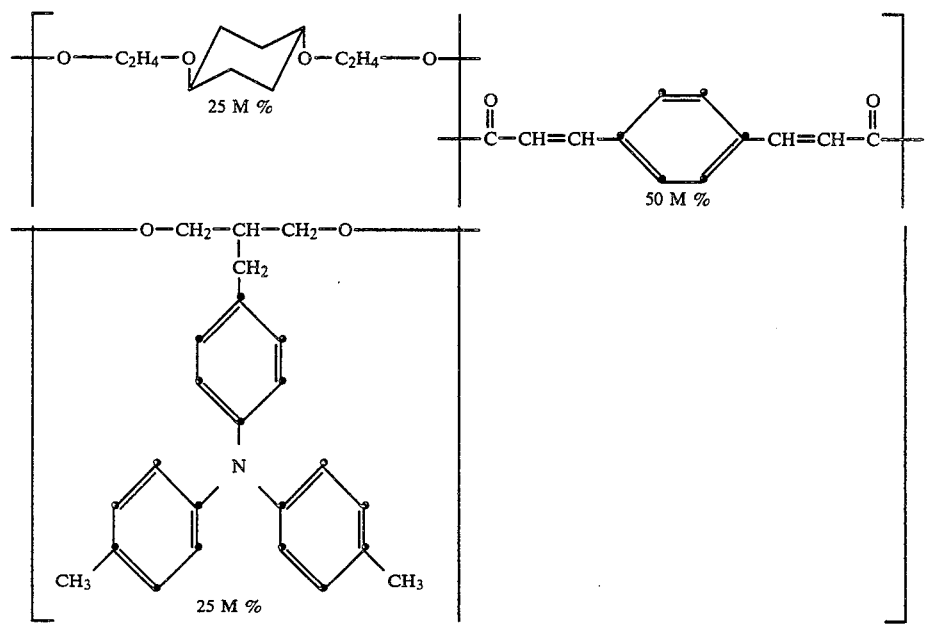

This polyester was a bright orange glassyamorphous polymer with a relatively high Tg of 75° C.

POLYESTER 6, TABLE I

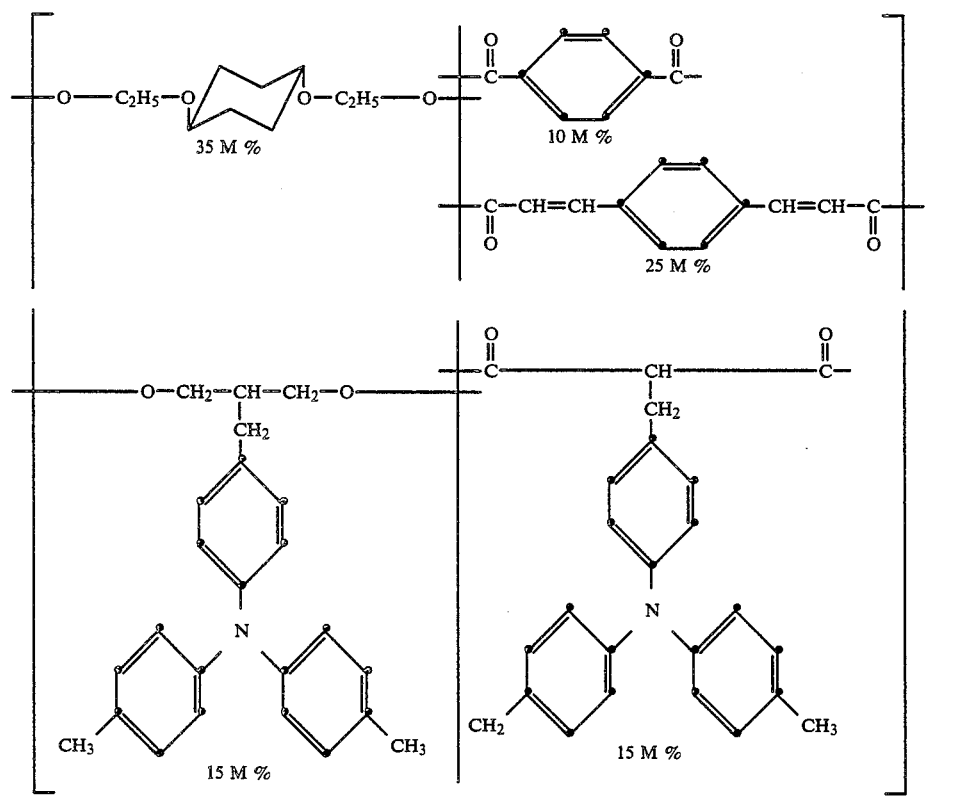

EXAMPLE 3

In a third preparation the photocrosslinkable component was incorporated into the portion of the polyester derived from acids, and the triarylamine photoconductive component was incorporated into both the acid-derived and diol-derived portions of the polymer. See Polyester 6.

This polyester, Polyester 6, an amber-orange glassy polymer had a Tg of 67° C.

Table I lists the polyesters of examples 1–3 and compositional variations of other photocrosslinkable-photoconductive polyesters including the mole percents of the various starting acid and diol monomers.

TABLE I

| Polyester No. | Diols* A | Diols* B | Diacids** C | Diacids** D | Diacids** E | Diacids** F | η | Tg °C. |
|---|---|---|---|---|---|---|---|---|
| 1 | 50 | | | 25 | 25 | | 0.35 | 49 |
| 2 | 25 | 25 | 25 | 25 | | | 0.32 | 79 |
| 3 | 25 | 25 | | 50 | | | 0.20 | 75 |
| 4 | 50 | | 10 | 20 | 20 | | 0.44 | 49 |
| 5 | | 50 | | 50 | | | 0.14 | 89 |
| 6 | 35 | 15 | 10 | 25 | 15 | | 0.28 | 67 |
| 7 | 50 | | | 25 | 17.5 | 7.5 | 0.30 | 55 |
| 8 | 50 | | | 25 | 15 | 10 | 0.28 | 61 |
| 9 | 50 | | 8 | 17 | 17 | 8 | 0.27 | 53 |
| 10 | 26 | 24 | 10 | 26 | | 14 | 0.17 | 90 |

°Diol 1 (A) 1,4-bis(hydroxyethoxy)cyclohexane
°Diol 2 (B) 2-[4-(N,N—di-p-tolyl)benzyl]-1,3-propanediol
**Diacid 3 (C) dimethyl terephthalate
**Diacid 4 (D) diethyl 3,3'-(p-phenylene)diacrylate
**Diacid 5 (E) diethyl 2-[4-(N,N—di-p-tolyl)benzyl]malonate
**Diacid 6 (F) dimethyl 5-(4-sodiosulfophenoxy)-1,3-benzenedicarboxylate Coating compositions containing the polyesters of this invention can be prepared by dispersing or dissolving the polyester in any suitable solvent or combination of solvents used in the art to prepare polymer dopes. The solvents are chosen to be (a) substantially unreactive toward the polyesters within the time periods contemplated for maintaining the solvent and polymer in association and (b) compatible with the substrate employed for coating. The best choice of solvent will vary with the exact polymer and application under consideration. Exemplary preferred solvents include benzyl alcohol, water, cyclohexanone, dioxane, 2-methoxyethyl acetate, N,N-dimethylformamide, chloroform, trichloroethylene, 1,2-dichloroethane, 1,1-dichloroethane, 1,1,2-trichloroethane, tetrachloroethane, chlorobenzene and mixtures thereof.

Optimum concentrations of the polyesters in the coating solutions will also vary, depending upon the specific polymer, and coating method employed. Useful coatings are obtained when the coating solutions contain about 1 to 50 percent by weight, and, preferably, about 2 to 10 percent by weight polyester. Higher concentrations, of course, give satisfactory results. In any case coating compositions are designed so that the resulting layer comprises from 0.54 to 5.4 g/m$^2$ (50 to 500 mg of the polymer/ft$^2$).

Elements comprising a support and a radiation-sensitive layer comprising the polyester of this invention can be prepared from the described coating compositions by conventional coating techniques such as spray coating, dip coating, whirl coating, roller coating, etc.

The support in the element is conductive. It is in electrical contact with the coated composition of this invention. Such conductive supports are well known in electrophotography. Specific support materials which are useful in forming printing plates, particularly lithographic printing plates, include supports such as zinc, anodized aluminum, grained aluminum, copper and specially prepared metal and paper supports.

As stated hereinbefore, the polyesters of the invention are particularly useful in forming lithographic elements. Their use eliminates the need to prepare a separate silver halide graphic arts transparency.

In producing a lithographic plate using the coated composition comprising the polyester of the invention, the element is first corona-charged. After charging, the layer is exposed by, for example, a programmed laser thereby discharging the layer in exposed areas. An electrostatic latent image of the original is thus formed. The latent image is then developed with a toner composition of the type well known in electrophotography. Such toner compositions are disclosed in U.S. Pat. Nos. 3,973,902; 3,117,884; 2,907,674 and many other patents. The toner composition is selected so that deposition of the toner occurs in the discharged areas of the layer, thereby forming a positive electrophotographic image of the original. The positive electrophotographic image serves as a mask eliminating the need for preparing a separate silver halide graphic arts transparency.

The layer is then exposed with UV radiation causing the polyester in the layer to crosslink in the exposed areas. The uncrosslinked and toned portion of the layer is washed away with a developer. The result is a lithographic plate having crosslinked oleophilic printing surfaces.

Developing is carried out by flushing, soaking, swabbing or otherwise treating the layer with a solution (hereinafter referred to as a developer) which selectively solubilizes the unexposed areas of the layer. Such developers are well known in the lithographic arts. The developer for polyesters containing ionic groups is typically an aqueous alkaline solution having a pH in the range of from about 9 to 14. Basicity can be imparted to the developer by the incorporation of soluble inorganic basic compounds such as alkali metal hydroxides, phosphates, sulfates, silicates, carbonates and the like as well as combinations thereof. A commercial developer known as Polymatic ™ LP, available from Eastman Kodak Company is used in the examples hereinafter. Alternatively or in combination, basic, soluble organic substances such as amines, triethanol amine, diethylene amine, diethylaminoethanol, etc.) can be incorporated.

The developers for non-ionic polymers are organic solvent developers such as Polymatic ™ LP Developer available from Eastman Kodak Company.

The element can then be treated in any known manner consistent with its intended use. For example, printing plates are typically subjected to desensitizing etches. Where the developed layer forms a resist layer, the element is typically subjected to acidic or basic etchants and to plating baths.

The following examples are presented to further illustrate the invention.

EXAMPLE 4

Evaluation of Photographic Speed Due to Photocrosslinking

Representative polyesters of this invention were formulated at 5% by weight of the solvent and polymer in 1,2-dichloroethane with 4.4 weight percent, based on the polyester weight, of the coumarin sensitizer

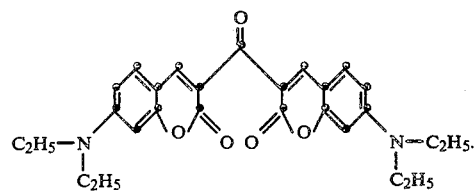

The dry coating was 4 to 12 μm thick. When Polymers 8, 9 and 10 of the Table I were used, the coumarin sensitizer was

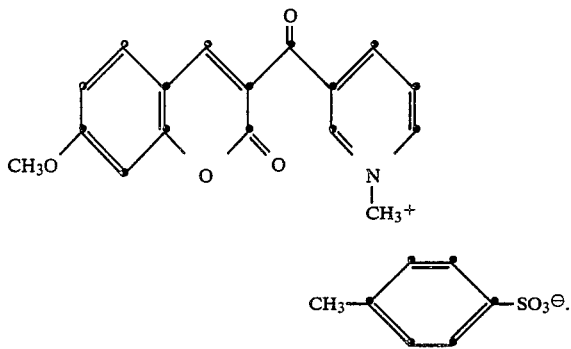

The formulations were whirl-coated on anodized-grained-subbed aluminum.

The films were exposed imagewise through a variable-density scale with a source which contained a high-pressure mercury vapor light source. The films were developed with the Polymatic TM LN Developer. The photographic speed results are listed in Table II in terms of the number of steps developed as a result of exposure through a step tablet having 14 density steps.

These results indicate that the minimum concentration of the polymerized recurring units containing photocrosslinkable component necessary for sufficient crosslink density is approximately 15 mole percent. These results also show that up to 8 steps are crosslinked when the polyester contains 17 mole percent photocrosslinkable component.

TABLE II

| Polyester No. | Exposure Through Density Step Tablet |
|---|---|
| 1 | 15 sec, 8 steps LN-L Developer |
| 2 | 15 sec, 6 steps LN-L Developer |
| 3 | 15 sec, 4 steps LN-L Developer |
| 4 | 15 sec, 8 steps LN-L Developer |
| 5 | 30 sec, 3 steps LN-L Developer |
| 6 | 30 sec, 6½ steps LN-L Developer |
| 7 | 30 sec, 5½ steps LN-L Developer |
| 8 | 30 sec, 5½ steps L.P. Developer |
| 9 | 30 sec, 8 steps Water at 80° C. |
| 10 | 30 sec, 4 steps Water at 80° C. |

EXAMPLE 5

Lithographic Plate

Polymers 2, 4 and 6 were dissolved in 1,2-dichloroethane at 12 weight percent with 4.6 weight percent of 3-benzoyl-5,7-dipropoxycoumarin sensitizer. Each solution was whirl-coated on anodized aluminum at 2400 rpm until dry. The dry layer thickness was about 2 μm and the coverage of the polyester was 4.3 g/m²(400 mg/ft²).

The layers were then charged with a corona charger to their maximum holding potential, $V_o$. They were then exposed with a 350 nm light source through a contact negative. The photodischarge speeds are shown in Table III. The electrostatic latent image was toned with a liquid toner under zero bias yielding high contrast images. These images were fused using a conventional lab hot plate. The layers were then exposed with 366–405 nm radiation through the developed electrophotographic image. The coatings were developed with the Polymatic TM LN Developer. The developer removed the electrophotographic image and uncrosslinked polymer areas, leaving an image of crosslinked polymer on the aluminum support which could subsequently be used as a printing plate.

TABLE III

Photoconductive Speed for Half-Decay ($S_{\frac{1}{2}}$) of Positively Charged, Front Surface Exposed, Electrophotographic Lithoplates at λ = 350 nm

| Polymer No. | $V_o$ (volts) | $S_{\frac{1}{2}}$ (ergs/cm²) |
|---|---|---|
| 4 | 381 | 58 |
| 4 | 601 | 105 |
| 2 | 341 | 46 |
| 6 | 392 | 51 |
| 6 | 282 | 42 |

EXAMPLE 6

This example illustrates the use of a sensitizer to enhance the photoconductive response of the polyesters of this invention.

Hand coatings were made with 96.4 weight percent of Polyester 2 (Table I) in dichloromethane and toluene (3:1 ratio) at a coverage of 150 mg/ft² (1.6 g/m²). The visible light sensitizer 2,6-diphenyl-4-(2,6-diphenyl-4H-thiopyran-4-ylidene)-thiopyrylium perchlorate and the UV sensitizer, 3,3'-carbonylbis(5,7-dipropoxycoumarin), were present at 0.6 and 3.0 weight percent, respectively. The coatings were made on aluminized poly(ethylene terephthalate) film support, and then fumed as described in U.S. Pat. No. 4,429,030 and were 1.8 μm thick.

The films were charged with a corona charger to their maximum holding potential. They were held at this charge level for 30 seconds before measuring the charge potential Vo. The films were then discharged with 640 nm monochromatic light (tungsten light source). Discharge speeds were measured in a negative and positive mode (bimodal). The speeds are recorded as the exposures required at 640 nm to reduce the initial voltage Vo to half its value ($S_{\frac{1}{2}}$) in ergs/cm². The results are recorded in Table IV.

TABLE IV

| $V_o$ (Volts) | Polarity | $S_{\frac{1}{2}}$ (ergs/cm²) |
|---|---|---|
| 260 | + | 48 |
| 270 | − | 63 |

The invention has been described in detail with particular reference to preferred embodiments thereof, but it will be understood that variations and modifications can be effected within the spirit and scope of the invention.

We claim:

1. A polyester comprising at least 12 mole percent polymerized recurring units containing an arylamine photoconductive component and at least 15 mole percent polymerized recurring units containing a photopolymerizable component and wherein each of said components is responsive to a different wavelength of light.

2. The polyester of claim 1 wherein the polymerized recurring units containing the arylamine photoconductive component (a) comprises from 12 to 50 mole percent of the polyester, and (b) has the structure:

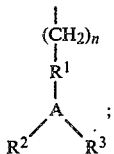

wherein
n is an integer of from 1 to 6;
A represents nitrilo, alkanetriyl or alkenetriyl;
$R^1$ represents arylene;
$R^2$ and $R^3$ each independently represents dialkylaminoaryl, diarylaminoaryl, arylalkylamino, or when A is nitrilo, $R^2$ and $R^3$ are each independently alkyl or aryl.

3. The polyester of claim 1 or 2 wherein the polymerized recurring units containing photocrosslinkable components (a) comprise from 15 to 50 mole percent of the polyester, (b) is attached to the condensation residue of an organic diacid, and (c) is selected from those having the structures:

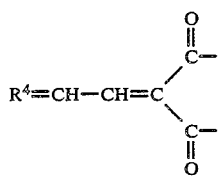 (A)

wherein
$R^4$ represents an alkylidene, aralkylidene or heterocyclic group, or a derivative thereof;

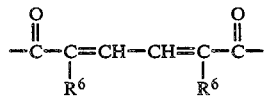 (B)

wherein
$R^6$ is a hydrogen atom or a methyl group;

 (C)

wherein
Z represents the atoms necessary to form an unsaturated, bridged or unbridged carbocyclic nucleus typically having 6 to 7 carbon atoms;

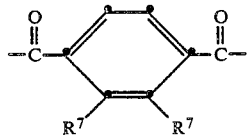 (D)

wherein
each $R^7$ is a hydrogen atom, an alkyl group of 1 to 12 carbon atoms of branched or straight chain or cyclic configuration; and

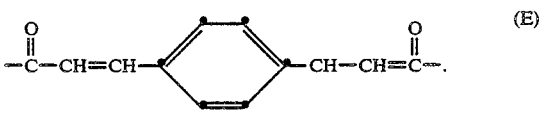 (E)

4. The polyester of claim 2 wherein the arylamine photoconductor component has the structure:

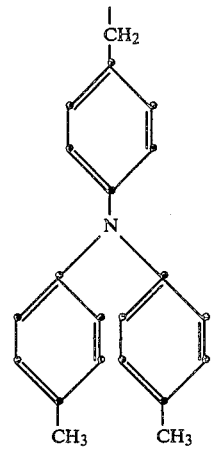

and the photopolymerizable component has the structure

5. The polyester of claim 1, 2, 3 or 4 which also comprises up to 20 mole percent of recurring units containing components selected from the group consisting of anionic sulfo groups and anionic iminodisulfonyl groups.

6. The polyester of claim 2 selected from the group consisting of:

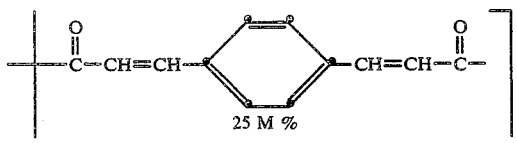

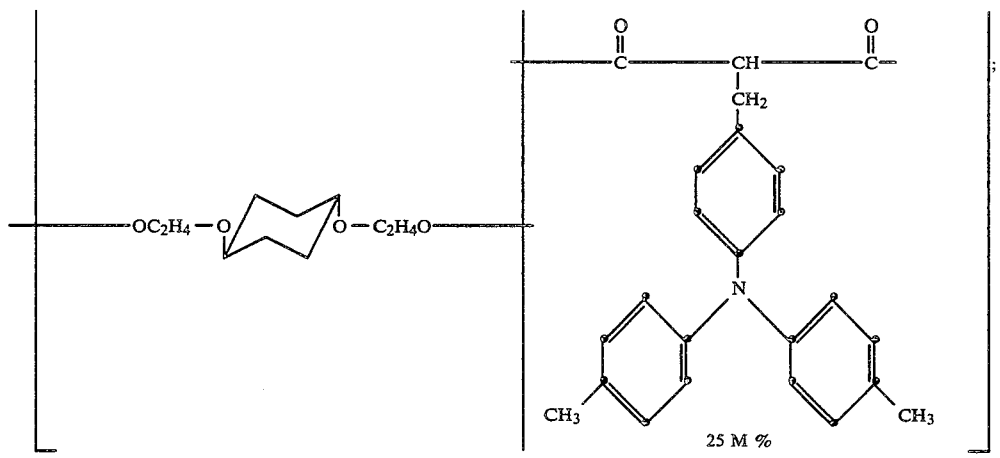
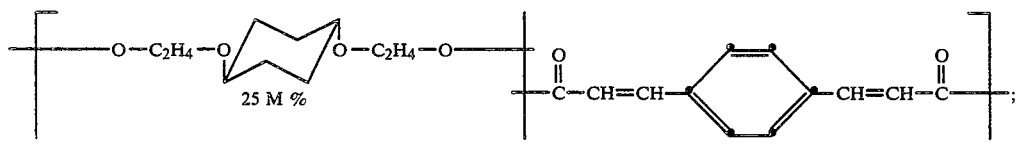
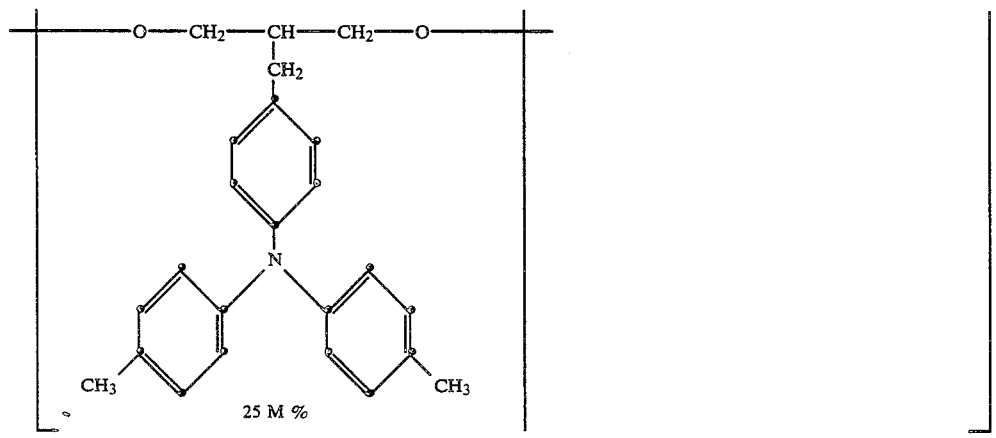
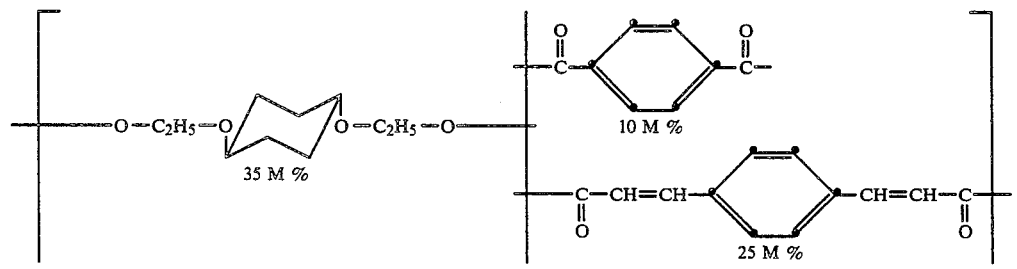

-continued

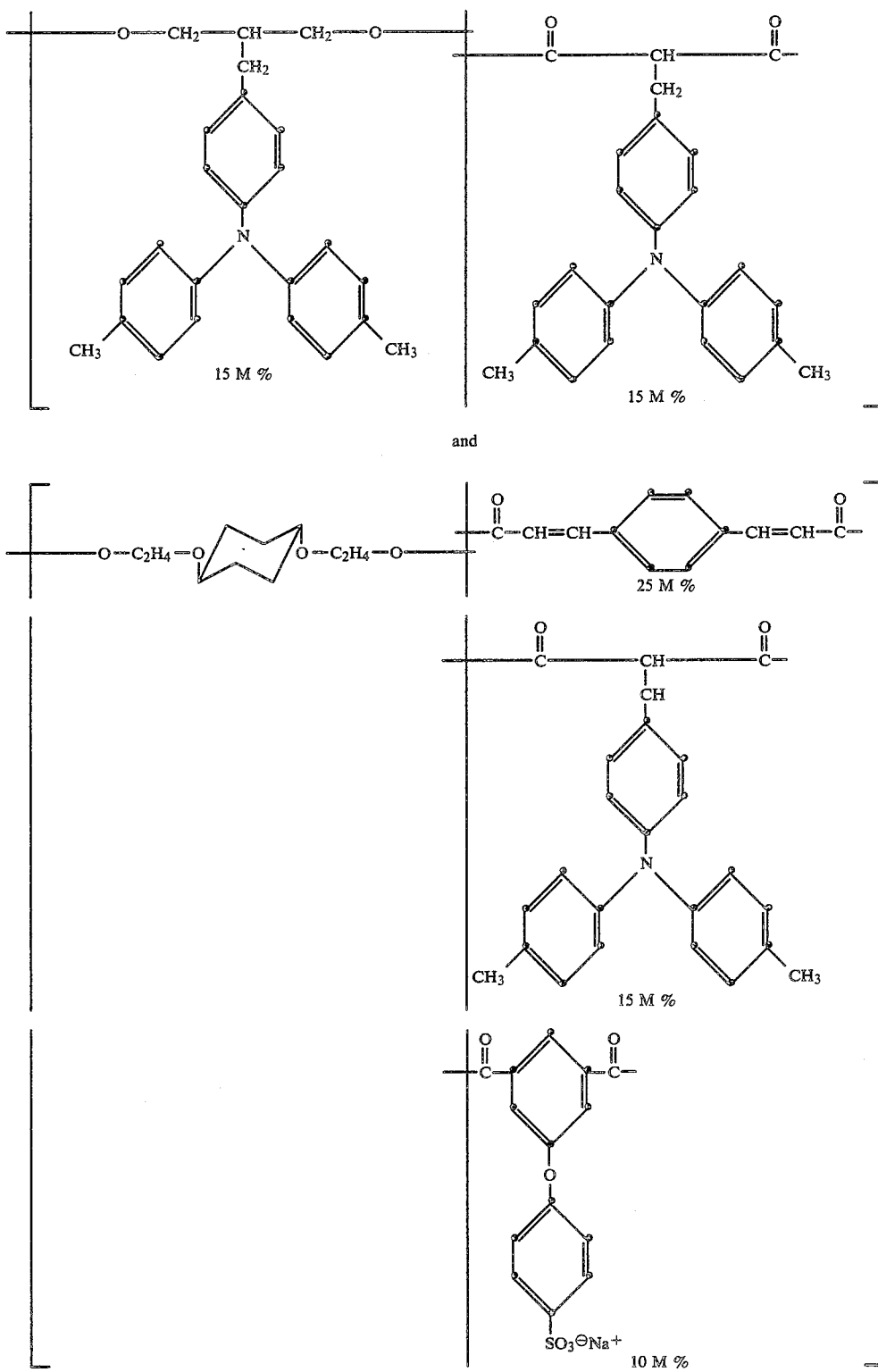

and

7. A radiation sensitive element comprising a conductive support in electrical contact with a radiation sensitive layer having therein a polyester comprising at least 12 mole percent of polymerized recurring units containing an arylamine photoconductive component and at least 15 mole percent recurring units containing a photopolymerizable component and wherein each of said components is responsive to a different wavelength of light.

8. The element of claim 7 wherein the polymerized recurring units containing the arylamine photoconductive component (a) comprise from 12 to 50 mole percent of the polyester, and (b) has the structure:

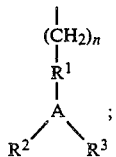

wherein
  n is an integer of from 1 to 6;
  A represents nitrilo, alkanetriyl or alkenetriyl;
  $R^1$ represents arylene;
  $R^2$ and $R^3$ each independently represents dialkylaminoaryl, diarylaminoaryl, arylalkylamino, or when A is nitrilo, $R^2$ and $R^3$ are each independently alkyl or aryl.

9. The element of claim 7 or 8 wherein the polymerized recurring units containing the photocrosslinkable component (a) comprises from 15 to 50 mole percent of the polyester, (b) is the condensation residue of an organic diacid; and (c) is selected from those having the structures:

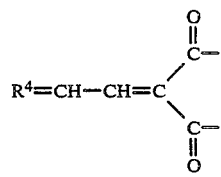
(A)

wherein
  $R^4$ represents an alkylidene, aralkylidene or heterocyclic group, or a derivative thereof;

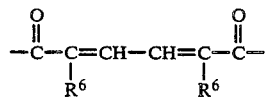
(B)

wherein
  $R^6$ is a hydrogen atom or a methyl group;

(C)

wherein
  Z represents the atoms necessary to form an unsaturated, bridged or unbridged carbocyclic nucleus typically having 6 to 7 carbon atoms;

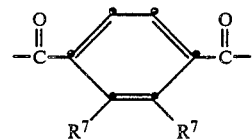
(D)

wherein
  each $R^7$ is a hydrogen atom, an alkyl group of 1 to 12 carbon atoms of branched or straight chain or cyclic configuration; and

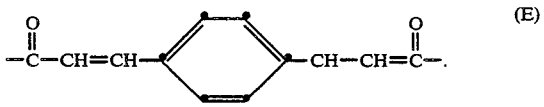
(E)

10. The element of claim 6, 7, 8 or 9 wherein the polyester thereof also comprises up to 20 mole percent of recurring units containing components selected from the group consisting of anionic iminodisulfonyl and of anionic sulfo groups.

11. The element of claim 6 or 7 wherein the arylamine photoconductor component has the structure:

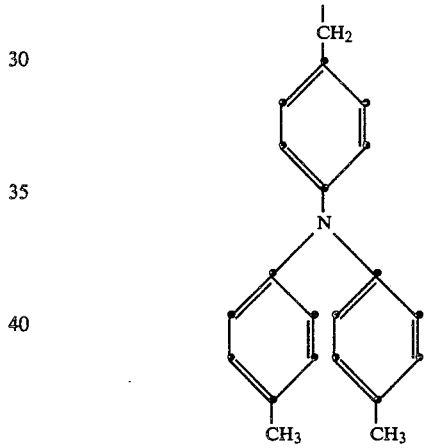

and the photopolymerizable component has the structure

12. The element of claim 7 wherein the polyester is selected from the group consisting of

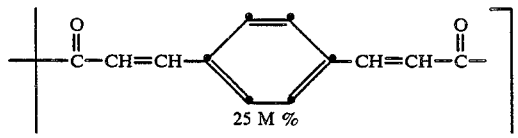

-continued
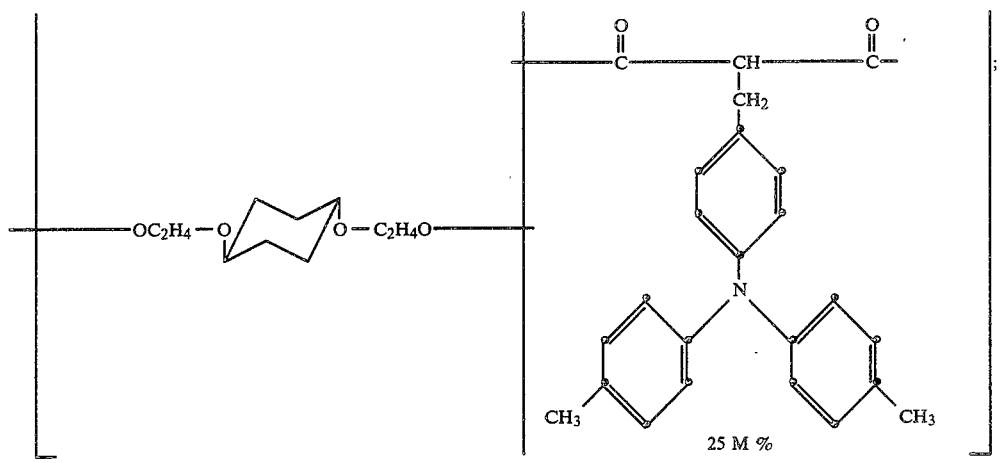
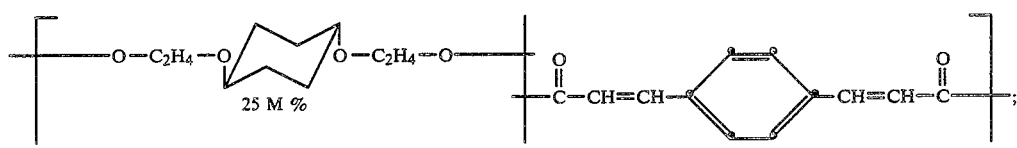
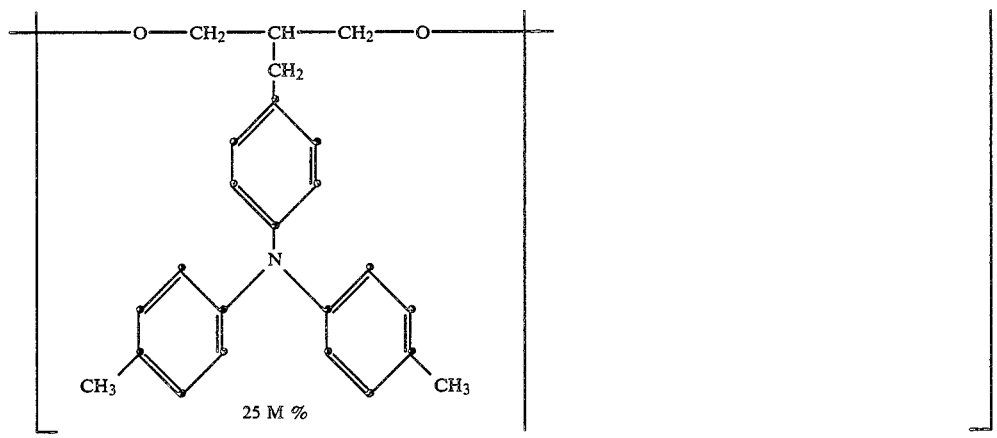
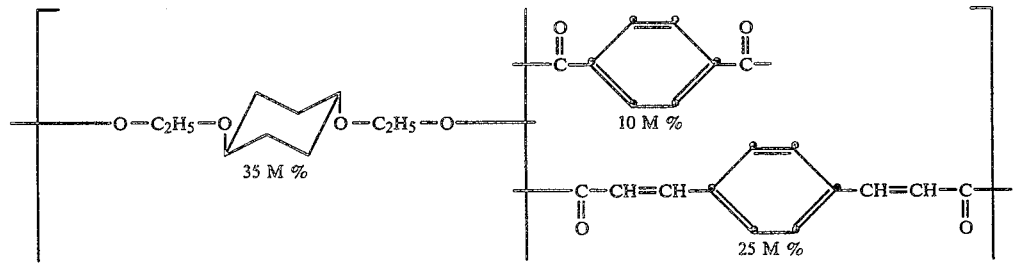

-continued
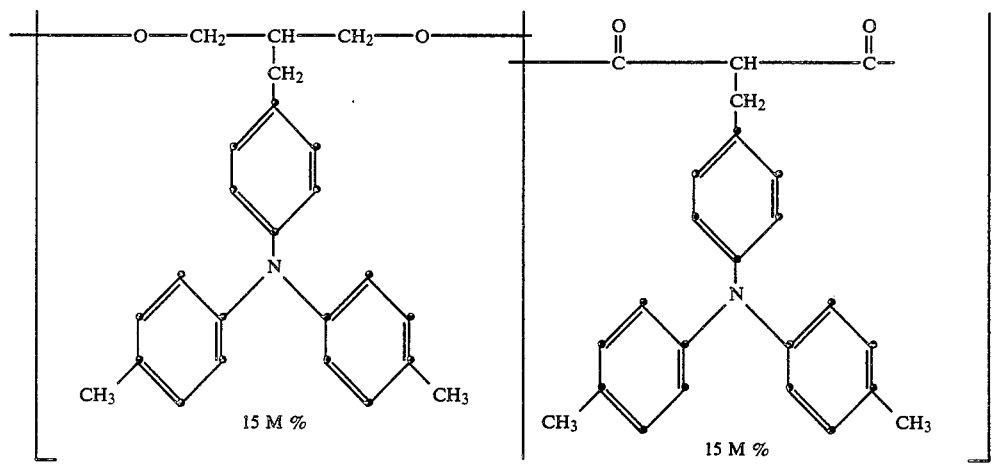
and
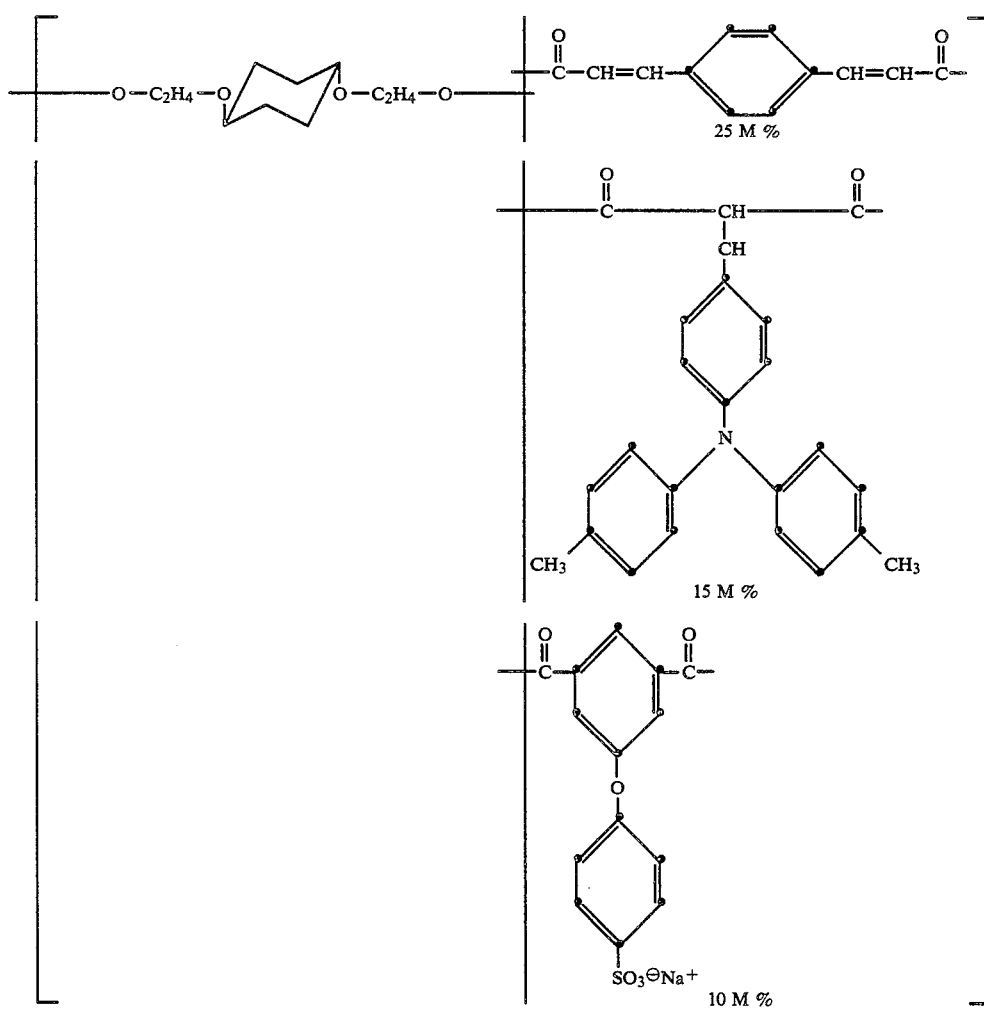
* * * * *